US008825424B2

(12) United States Patent
Rivoir

(10) Patent No.: US 8,825,424 B2
(45) Date of Patent: Sep. 2, 2014

(54) APPARATUS AND METHOD FOR ESTIMATING DATA RELATING TO A TIME DIFFERENCE AND APPARATUS AND METHOD FOR CALIBRATING A DELAY LINE

(75) Inventor: Jochen Rivoir, Magstadt (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 281 days.

(21) Appl. No.: 13/000,348

(22) PCT Filed: Jun. 20, 2008

(86) PCT No.: PCT/EP2008/005005

§ 371 (c)(1),
(2), (4) Date: Mar. 1, 2011

(87) PCT Pub. No.: WO2009/152837

PCT Pub. Date: Dec. 23, 2009

(65) Prior Publication Data

US 2011/0140737 A1 Jun. 16, 2011

(51) Int. Cl.
*H03D 13/00* (2006.01)
*G04F 10/00* (2006.01)

(52) U.S. Cl.
USPC ................................ 702/89; 327/12; 368/117

(58) Field of Classification Search
CPC ........... H03M 1/50; H03M 1/58; H03M 1/10; H03L 2207/06; H03L 7/085; G06F 10/005; G06F 1/00; G06F 3/00; G06F 5/00; G06F 7/00; G06F 8/00; G06F 10/06; G01R 31/31709; H03D 13/00
USPC ..................... 702/89, 125, 120, 175, 176, 79; 73/1.42; 368/113–120; 327/12
See application file for complete search history.

(56) References Cited

U.S. PATENT DOCUMENTS 5,796,682 A * 8/1998 Swapp .......................... 368/120
6,826,247 B1 * 11/2004 Elliott et al. ................. 375/376
(Continued)

FOREIGN PATENT DOCUMENTS

EP 1137188 A2 * 9/2001 ................ H03L 7/08
WO 01/69328 A2 9/2001
(Continued)

OTHER PUBLICATIONS

Jochen Rivoir "Fully-digital time-to-digital converter for ATE with autonomous calibration", 2006 IEEE, International Test Conference.*
Levine, et al., "A high-resolution flash time-to-digital converter and calibration scheme", 2004 IEEE, International Test Conference, p. 40.2.*
(Continued)

*Primary Examiner* — John Breene
*Assistant Examiner* — Ruihua Zhang

(57) ABSTRACT

An apparatus for estimating data relating to a time difference between two events includes a delay line having a plurality of stages. Each stage has a delay difference between a first delay in a first part and a second delay in a second part. This delay difference is measured by a phase arbiter in each stage, which outputs an indication signal indicating whether the first event of two events in the first part precedes or succeeds a second event of the two events in the second part. A summation device is provided for summing over the indication signals of the plurality of stages to obtain a sum value. The sum value indicates a time difference estimate.

16 Claims, 13 Drawing Sheets

(56) References Cited

U.S. PATENT DOCUMENTS

| | | | | |
|---|---|---|---|---|
| 7,205,924 | B2 * | 4/2007 | Vemulapalli et al. | 341/166 |
| 7,548,823 | B2 * | 6/2009 | Singh et al. | 702/79 |
| 2003/0107951 | A1 | 6/2003 | Sartschev et al. | |
| 2006/0103566 | A1 | 5/2006 | Vemulapalli et al. | |

FOREIGN PATENT DOCUMENTS

| | | | |
|---|---|---|---|
| WO | 2007/093222 | A1 | 8/2007 |
| WO | WO2008033979 | | 3/2008 |
| WO | 2009/152837 | A1 | 12/2009 |

OTHER PUBLICATIONS

Chang, et al., "An innovative linear response time-to-digital converter with a branched propagation delay chain", Review of Scientific Instruments, vol. 71, No. 6, Jun. 2000.*

B. Nelson, et al., "On-chip calibration technique for delay line based bist jitter measurement", IEEE, 2004.*

Rivoir, Jochen; Fully-Digital Time-to-Digital Converter for ATE with Autonomous Calibration; International Test Conference; 2006; pp. 1-10.

Rivoir, J., "Fully-Digital Time-To-Digital Converter for ATE with Autonomous Calibration", IEEE International Test Conference, 2006, paper 6.3.

* cited by examiner

| test sum value | calibration value $n_c$ or $p_c = \frac{n_c}{N_{cal}}$ or $D_c = p_c \cdot R$ |
|---|---|
| 1 | table entry for "1" |
| 2 | . . . |
| 3 | . . . |
| . . . | . . . |
| N | . . . |

e.g.
sum value = sum of indication signals with logical "1"; logical "1", when 1st event precedes 2nd event ⇒ test sum value is small → time difference between events is small

---

⇒ test sum value is high → time difference between events is high $N_{stages}$ $N_{cal}$: number of all calibration events $n_c$: number of occurences of calibration sum value c in the calibration measurements $p_c$: probability for calibration sum value c $D_c$: time increase for sum value c

FIG 3

| | | | | | | | | | | | |
|---|---|---|---|---|---|---|---|---|---|---|---|
| prior art inv. | stage No. | 1 | 2 | 3 | 4 | 5 | 6 | 7 | 8 | 9 | |
| | count value | 1 | 2 | 3 | 4 | 5 | 6 | 7 | 8 | 9 | |
| | indic sign. | 1 | 1 | 1 | 0 | 1 | 1 | 0 | 1 | 0 | |
| prior art | cal. value | Y | Y | Y | Y | N | N | N | N | Y | |
| inv. | cal. value | Y | Y | Y | Y | Y | Y | Y | Y | Y | |

prior art: priority encoder output: 4 invention: test sum value: 6

Prior art: $c=4$ $D_{ij}$: increase from stage i to stage j $$\tilde{t}=D_{01}+D_{12}+D_{23}+\frac{1}{2}D_{34}$$
$$\hat{=}D_1 \quad \hat{=}D_2 \quad \hat{=}D_3 \quad \hat{=}D_4$$

Invention: $c=6$ $$\tilde{t}_c=\sum_{i=1}^{c-1}D_i+\frac{1}{2}D_c$$

$$\tilde{t}=D_{01}+D_{12}+D_{23}+D_{35}+D_{56}+D_{68}+\frac{1}{2}D_{87}$$

| test sum value c | calibration value | |
|---|---|---|
| 0 | $D_{01}$ | $\hat{=}D_0$ |
| 1 | $D_{12}$ | $\hat{=}D_1$ |
| 2 | $D_{23}$ | $\hat{=}D_2$ |
| 3 | $D_{35}$ | $\hat{=}D_3$ |
| 4 | $D_{56}$ | $\hat{=}D_4$ |
| 5 | $D_{68}$ | $\hat{=}D_5$ |
| 6 | $D_{87}$ | $\hat{=}D_6$ |
| ⋮ | ⋮ | |

time difference calibration:

$$\tilde{t}_c=\sum_{i=0}^{c-1}D_i+\frac{1}{2}D_c$$

FIG 5C

All flip-flop outputs are combined to one single sum.

Statistical variations of buffer delays lead to a fine grid of accumulated delays Resolution is determined by the overall number of delay differences (flip-flops), for a given range.

APPARATUS AND METHOD FOR ESTIMATING DATA RELATING TO A TIME DIFFERENCE AND APPARATUS AND METHOD FOR CALIBRATING A DELAY LINE

BACKGROUND OF THE INVENTION

The present invention is related to signal processing and, specifically, to signal measurement devices used in automatic test equipments.

Time-to-digital converters (TDC) in automatic test equipment applications time stamp selected events from the device under test (DUT), i.e. measure the arrival time relative to a tester clock. A time stamper is also known as a continuous time interval analyzer.

Time stamp measurements have a large number of applications in test, each with different requirements. Jitter measurements of high-speed serial interfaces necessitate a high resolution of about 1% of a bit period, i.e. 3 ps at 3 Gbps and can be made using time stamps. The signal may have an arbitrary phase relative to the tester clock. Skew measurements between clock and data of source-synchronous busses necessitate a high resolution of about 1% of bit period combined with a highest possible sample rate to obtain high coverage of sporadic timing violations. Clock-to-output measurements of slow digital outputs necessitate a very large dynamic range at moderate resolution. I/Q phase imbalance measurements can necessitate 1 ps resolution in a dynamic range of 1 μs. Dynamic PLL measurements necessitate sample rates in the order of 100 Msa/s (mega samples per second) to follow the loop dynamics. Write-precompensation tests of DVD and HDD channels necessitate fast and accurate time measurements.

A fully digital time-to-digital converter is disclosed in "Fully Digital Time-to-Digital Converter for ATE with Autonomous Calibration", Jochen Rivoir, International Test Conference 2006, paper 6.3.

A vernier delay line is described, which is a fast "flash" version of a vernier oscillator TDC, which is also known as a component-invariant delay line. In a vernier delay line, two delay line branches with slightly different average gate delays achieve an average sub-gate delay resolution. The measured event injects a pulse into this slow delay line with average buffer delays, the next coarse clock edge is injected into the fast delay line with different average buffer delays. Starting with an initial time difference, each stage reduces the difference by a nominal delta value until the time difference becomes negative after a number of c stages. Flip-flops in each stage act as phase arbiters between the two racing pulses. A positive phase difference is captured as "1" and a negative phase difference is captured as a logical "0", where the negative phase difference happens in a stage c at a first time. A priority encoder is connected to the output of each phase arbiter and the priority encoder outputs the first stage capturing a "0" value. Vernier delay differences of between the delays in one stage of about 1 ps are possible with modern CMOS processes. A fine time range $T_R$ which equals one coarse clock period necessitates $$S = \frac{T_R}{\Delta\tau}$$

stages. When using a parallel read-out, the propagation time through S buffers with a delay $\tau_s$ limits the sample rate to $$F_S = \frac{1}{S\tau_s} = \frac{\Delta\tau}{T_R\tau_s}$$

However, unavoidable gate delay mismatches lead to non-linearities and even significantly non-monotonic behavior. To address this issue, a statistical linearity calibration is implemented, which uses a large number of events that are uniformly distributed across one coarse clock period, i.e. the time range of the vernier delay line interpolator. On average, the number of captured "1" in a given vernier stage is proportional to its accumulated vernier delay and, thus, can be used to calibrate the vernier delay line (VDL). A (free running) ring oscillator can generate events that are uncorrelated to the coarse clock to a sufficient degree and, thus, uniformly distributed.

In high-resolution designs, the chain of accumulated vervier delays can easily be non-monotonic. This means that from one stage to the next, the accumulated venier delay can remain the same or can even decrease. On average, an accumulated venier delay increases, for example, by 1 ps per stage, but varies from −3 ps to +5 ps between subsequent stages. For non-monotonic accumulated venier delays $T_k$, there can be multiple stage changes between neighboring flip-flops. Finding the stage with the closest accumulated venier delay using real-time hardware necessitates knowing all accumulated delays. Therefore, typical flash convertees, such as the venier delay line TDC uses a simple priority encoder to identify the stage number c of the first flip-flop that captures a "0". Thus, stages whose $T_k$ is smaller than those of previous stages are ignored.

The statistical linearity calibration is based on a code density calibration. Specifically, a probability $p_c$ of hitting code c is proportional to the time window that leads to code c, i.e. the increase of $G_c$ from the previous stage c-1. For N events, code c can be expected, $\hat{n}_c$ times $$\hat{n}_c = Np_c = N\frac{D_c}{T_R}$$

The actual count $n_c$ can be used for an estimate $\tilde{D}_c$ of the monotonic increase $D_c$ $$\tilde{D}_c = \frac{n_c}{N}T_R$$

Iterating $$D_c = G_c - G_{c-1}$$

yields the estimated accumulated vernier delays $\tilde{G}_c$ $$\tilde{G}_c = \tilde{G}_{c-1} + \tilde{D}_c = \sum_{i=1}^{c}\tilde{D}_i$$

A mission-mode measurement with code c will return the calibrated measured time interval $\tilde{t}$ as the mean of the two adjacent growing delays.

$$\tilde{t} = \frac{1}{2}\left(\tilde{G}_c + \tilde{G}_{c-1}\right) = \sum_{i=1}^{c-1} \tilde{D}_i + \frac{1}{2}\tilde{D}_c$$

While this concept is advantageous for several applications due to the easy-to-implement and fast-to-implement calibration process, nevertheless, there exists a situation in which the accuracy of the measurements is not fully optimum.

SUMMARY

According to an embodiment, an apparatus for estimating data relating to a time difference between two events may have: a delay line having a plurality of stages, each stage having a first delay in a first part and a second delay in a second part, the first delay and the second delay being different from each other, and each stage (having a phase arbiter indicating by an indication signal having one of two different states, whether a first event of the two events in the first part precedes or succeeds a second event of the two events in the second part; and a summation device for summing over the indication signals of the plurality of stages to obtain a sum value indicating an estimate of the time difference.

According to another embodiment, a method of estimating data relating to a time difference between two events using a delay line having a plurality of stages, each stage having a first delay in a first part and a second delay in a second part, the first delay and the second delay being different from each other and each stage having a phase arbiter indicating by an indication signal having one of two different states, whether a first event of the two events in the first part precedes or succeeds a second event of the two events in the second part, may have the step of: summing, over the indication signals of the plurality of stages, to obtain a sum value indicating a time difference estimate.

According to another embodiment, a method of calibrating a delay line having a plurality of stages, each stage having a first delay in a first part and a second delay in a second part, the first delay and the second delay being different from each other and each stage having a phase arbiter indicating by an indication signal having one of two different states, whether a first event of two events in the first part precedes or succeeds a second event of the two events in the second part, may have the steps of: connecting a source of calibration events to a first input connected to the first part of a first stage of the plurality of stages, the source of calibration events being such that the calibration events are distributed over a full measurement range of the delay line; in response to a calibration event, summing over the indication signals of the plurality of stages to obtain a calibration sum value; repeating the step of summing for a number of calibration events, which is higher 2N, N being the number of all stages of the delay line, so that more than 2N calibration count values are obtained; and for each calibration sum value, determining a number of occurrences of the calibration sum value in all calibration count values and storing a calibration value for the calibration sum value, which depends on the number of occurrences in a calibration storage.

According to another embodiment, an apparatus for calibrating a delay line having a plurality of stages, each stage having a first delay in a first part and a second delay in a second part, the first delay and the second delay being different from each other and each stage having a phase arbiter indicating by an indication signal having one of two different states, whether a first event of two events in the first part precedes or succeeds a second event of the two events in the second part, may have: a connector for connecting a source of calibration events to a first input connected to the first part of a first stage of the plurality of stages, the source of calibration events being such that the calibration events are distributed over a full measurement range of the delay line; a summation device for summing over the indication signals of the plurality of stages to obtain a calibration sum value, in response to a calibration event; a controller for repeating the step of summing for a number of calibration events, which is higher than 2N, N being the number of all stages of the delay line, so that more than 2N calibration count values are obtained; and a processor for determining, for each calibration sum value, a number of occurrences of the calibration sum value in the more than 2N calibration count values and storing a calibration value for the calibration sum value, which depends on the number of occurrences in a calibration storage.

Another embodiment may have a computer program having a program code for performing when running on a computer, the inventive methods.

The present invention is based on the finding that a delay line read-out based on the priority encoder wastes information from stages having a non-monotonic accumulated vernier delay. Specifically, a stage having an accumulated delay smaller than the accumulated delay of a preceding stage is "in the shadow" of the accumulated delay of the preceding stage. This means that due to the priority encoder attached to the phase arbiters of the different stages, this "shadowed" stage will never be used during an actual measurement, since the priority encoder makes sure that this stage will never occur as a "winning" stage having, for example, a first "0" indication signal. Consequently, this "shadowed" state does not receive any calibration values, since these calibration values are never used for calculating an actual time difference between two events, i.e. between an edge of a measurement signal to be measured and a clock edge of a reference clock as the two different events.

Thus, the conventional priority encoder effectively cuts out any stages of the delay line, which do not show a monotonic behavior. Thus, even though one has, for example, created the vernier delay line having a certain number of stages, the actual number of stages contributing to the accuracy of the measurement is substantially lower than the real number of stages existing in hardware. This discrepancy between the stages actually used and the actually manufactured stages increases more and more when the requirements for speed and fine resolution grow, or when the manufacturing tolerances increase.

Furthermore, the priority encoder urges the designer to implement a serial ordering of stages of a vernier delay line without branching to obtain a monotonous increase of accumulated delays. As the resolution of the time measurement is determined by the number of stages (divided by the full measurement range), high resolution implementations necessitate a high number of stages, i.e. a long chain of stages which leads to a reduced re-trigger rate, because of the long propagation delay through the vernier delay line.

In addition, due to the difference between the stages actually used and actually manufactured stages there exists an uncontrollable accuracy problem of the device, since the accuracy of the device will be poor in regions where there are several "shadowed" stages, and the measurement accuracy will be high in other regions of the device having no or only a small number of shadowed stages. Since, however, specifications are so that the poorest resolution portion determines the overall resolution specification of the device, producing devices having a very high-resolution specification will result in a high number of devices, which fail the final quality test. This enhances the cost of the manufacturing process per useful device to a high degree.

All these problems are addressed by replacing the priority read-out by a summation read-out. Thus, all stages having an accumulated vernier delay below the actual time difference are used for measurement, since the dogma of having a monotonic vernier delay line is abandoned. Instead, summing over the indication signal outputs of the phase arbiters will use each and every stage for measurement without any limitations regarding the monotonicity requirement. Instead, each stage is addressed in the calibration process and is used in the measurement process. Thus, the read-out based on a sum value might be considered to provide a kind of "re-sorting" of the stages in a monotonous order, although, in fact, the actual hardware delay line is still non-monotonous.

In accordance with embodiments of the present invention, a statistical linearity calibration is performed, but with a sum read-out instead of a priority read-out. This calibration process advantageously allows using each and every stage be it a monotonic stage or not in the measurement so that each stage contributes to the resolution.

The present invention results not only in an increased production yield and improved circuit characteristics at lower costs, but also allows a completely flexible design, since the summation device does not care about any orders of stages, but provides a count value, which is independent of the order of the stages contributing to this count value. Therefore, the present invention allows flexibility of design using branched delay lines or any other configuration of delay stages as long as each phase arbiter provides its indication signal to the summation device. Since, by nature, each stage will have a certain actual delay difference and since all these stages will be used in accordance with the present invention, the resolution of the vernier delay line does not depend on the number of stages in which a clock edge or a measurement edge has to propagate, but depends on a number of stages having distributed delay differences between the first part having a first delay and the second part having a second delay of a delay line stage.

Principally, a delay line having a comparably small number of sequentially-arranged stages, but having a substantial amount of parallel stages can be implemented, which has a heavily reduced propagation delay of a signal edge through the whole delay line so that a re-trigger rate can be considerably enhanced without a penalty in terms of semiconductor area, etc.

BRIEF DESCRIPTION OF THE DRAWINGS

Embodiments of the present invention will be detailed subsequently referring to the appended drawings, in which:

FIG. 3 illustrates a schematic representation of a table stored in the calibration storage;

FIG. 5*c* illustrates the calculations performed by a processor for calculating a time stamp value in an embodiment;

DETAILED DESCRIPTION OF THE INVENTION

Figure 1:
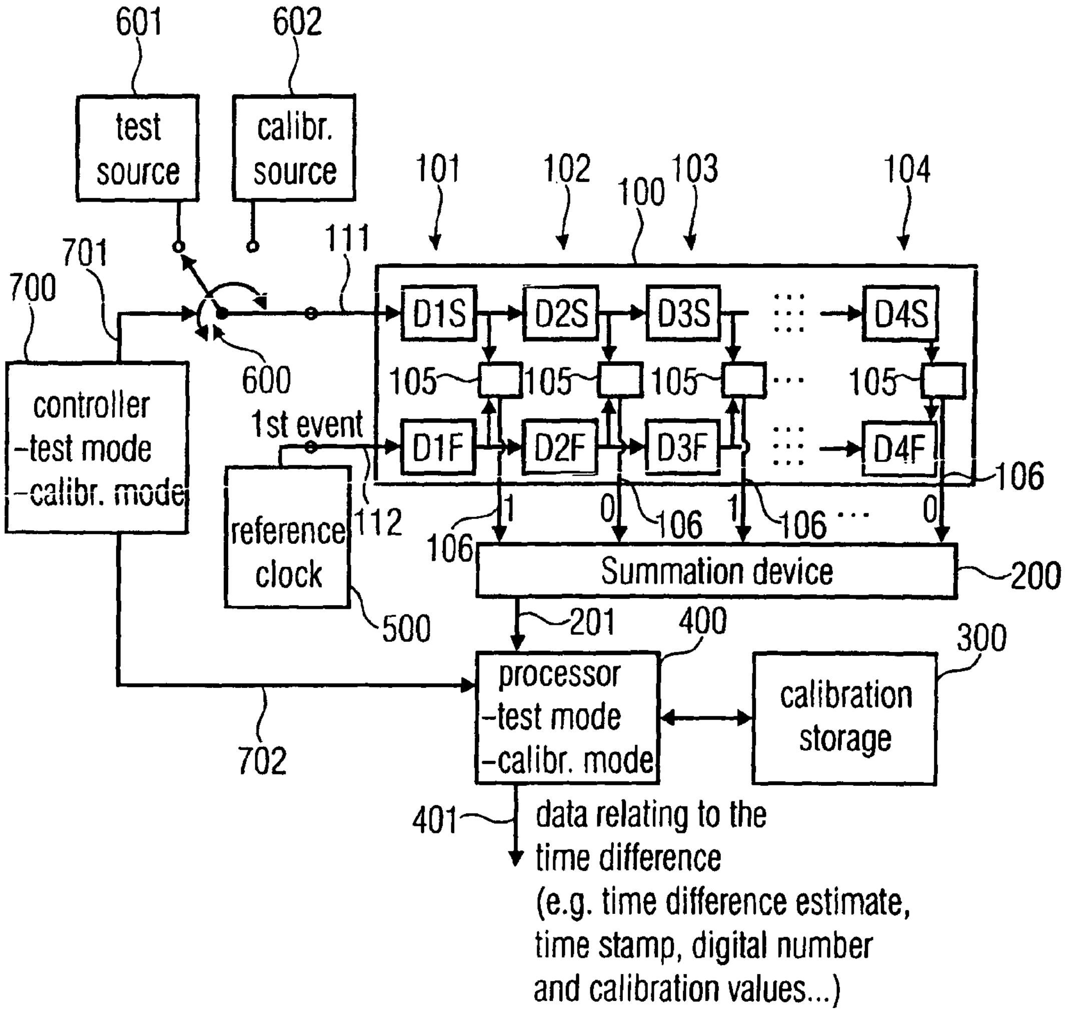
FIG. 1 illustrates an embodiment of an apparatus for estimating data relating to a time difference.
Figure 8:
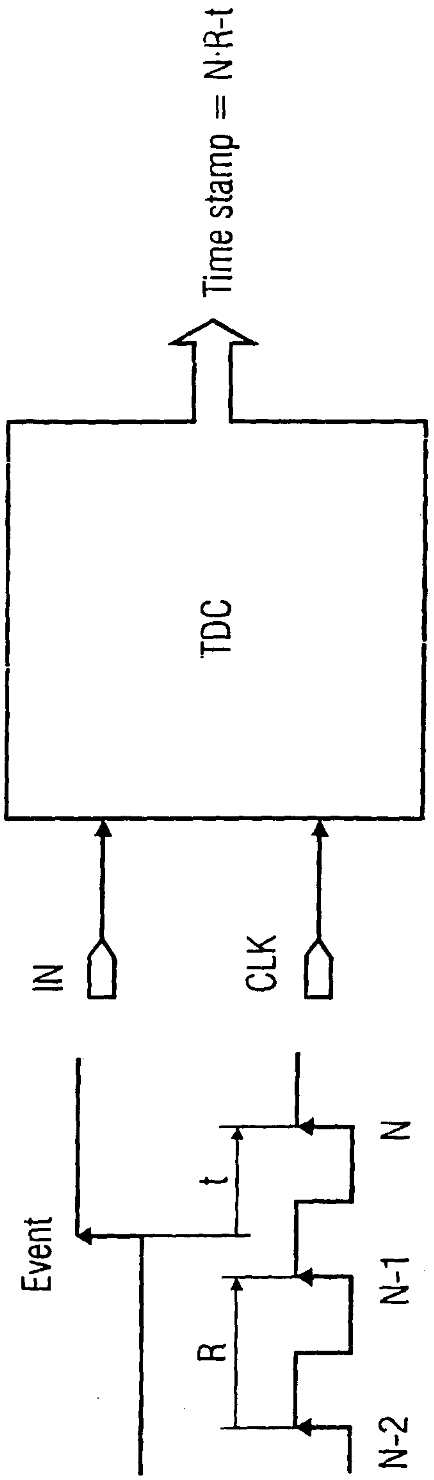
FIG 8 (Prior Art)
FIG. 8 illustrates a measurement set-up for providing a time stamp representing a time between a test edge and a reference clock edge as the two events.

FIG. 1 illustrates an apparatus for estimating data relating to a time difference between two events. An exemplary time difference between two events is indicated in FIG. 8 where there is a first input into the time to digital converter or, specifically, into a delay line not illustrated in FIG. 8 and in which a second input into the TDC (Delay Line) is indicated as well. The first input is connected to a test signal having a test signal edge indicated as "event" in FIG. 8. The second event is represented by a rising edge of a clock signal connected to the second input (CLK) of the TDC. The test clock has a period of R and the TDC measures the distance t as indicated in FIG. 8. Thus, the complete time stamp output by the TDC in FIG. 8 is equal to $N \times R - t$. Depending on different applications of the present invention, one input into the TCC need not necessarily be a clock, i.e. the reference clock of the automatic test equipment, but the input can also be another test edge when the difference between two test edges as the two events is necessitated.

The two events are input into a delay line 100. In particular, the delay line comprises a plurality of sequentially-arranged stages 101 to 104.

Each stage includes a first delay such as D1S in a first part, which is the upper part of the stage in FIG. 1, and a second delay D1F in a second part of the delay stage, which is the lower part in FIG. 1. Both delays D1S and D1F are different from each other so that there is a delay difference $\Delta\tau$ between both delays. Furthermore, each stage includes a phase arbiter 105. The phase arbiter indicates, by an indication signal having two different states, that the first event of the two events in the first part of a delay stage precedes or succeeds a second event of the two events in the second part of the delay stage. In the FIG. 1 embodiment, the indication signal is provided via an indication line 106 which forms an output line of each phase arbiter circuit 105. All indication signal lines connected to the phase arbiter output are connected to a summation device 200. The summation device is operative to sum over the indication signals of the plurality of stages 101 to 104, which provide output signals on the indication signal lines 106 from all stages to obtain a sum value output at summation device output line 201. Depending on the specific implementation of the apparatus of FIG. 1, the summation device output on line 201, i.e., the sum value represents the data relating to a time difference between the two events. Specifically, the sum value indicates that there are two stages, i.e., stages 101 and 103 in the FIG. 1 embodiment, each having an accumulated delay which is smaller than the time difference between the two events. Thus, the sum value indicates a time difference estimate. On the other hand, the sum value additionally indicates that there are exactly two such stages and there will not exist any more stages in the delay line, which have an accumulated delay smaller than the time difference between the first event and the second event to be measured by the inventive apparatus.

Depending on the specific implementation, the inventive apparatus additionally includes a calibration storage 300 for storing calibration values associated with different sum values. Furthermore, an embodiment additionally comprises a processor 400 for processing a test sum value obtained in a test measurement and the calibration values stored in the calibration storage to obtain the data relating to the time difference which are output at the processor output 401.

The data relating to the time difference can, in addition to the actual sum value at line 201, a time difference estimate as, for example, calculated in accordance with the equations in FIG. 5*c* or a time stamp value calculated in accordance with the setup illustrated in FIG. 8. The data relating to the time difference can also be a digital number, i.e., the sum value or a code derived from the sum value and, additionally, calibration values which belong to the digital number and which are necessitated for calculating a digital value such as a sum value or a code derived from the sum value by a specific encoding operation, or for calculating, using the actual calibration information, the actual time difference in e.g. ps between the two events.

The FIG. 1 embodiment additionally includes a reference clock source 500 which may be connected to the second (lower) input of the delay line indicated at 112. The delay line additionally includes a first input 111 which is connected to the first part having the first delay D1 of the first stage 101 of the delay line 100. The first input of the delay line is connected to a switch 600, which is controlled by a controller 700. In response to a control signal on line 701 from the controller 700, the switch 600 is operative to either connect a test source 601 or a calibration source 602 to the first input 111 of the delay line 100. Furthermore, the controller is connected to the processor via a processor control line 702. Thus, the controller can control the processor 400 to be in either the test mode or the calibration mode. In the test mode, the tests source 601 is connected to the first input 111, and in the calibration mode, the calibration source 602 is connected to the first input 111 of the delay line 100.

Figure 2:
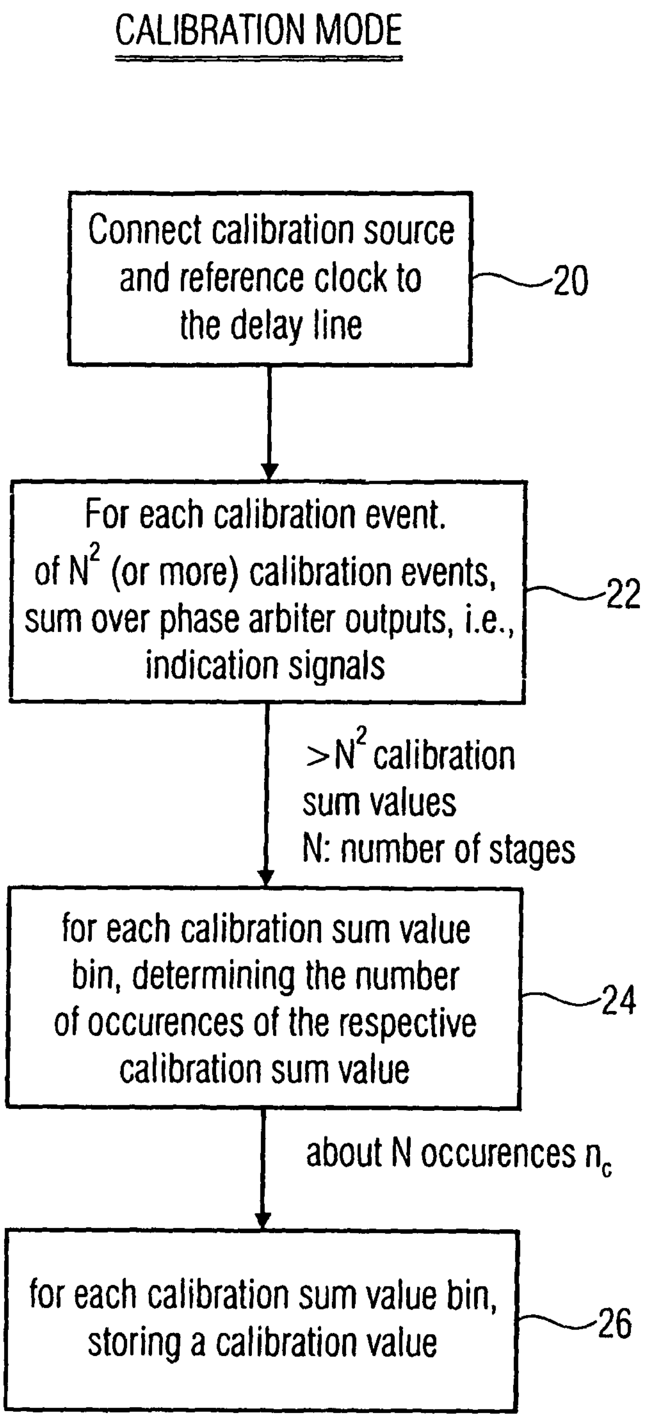
FIG. 2 illustrates a sequence of steps in one embodiment representing a calibration mode.
Figures 5A, 5B:
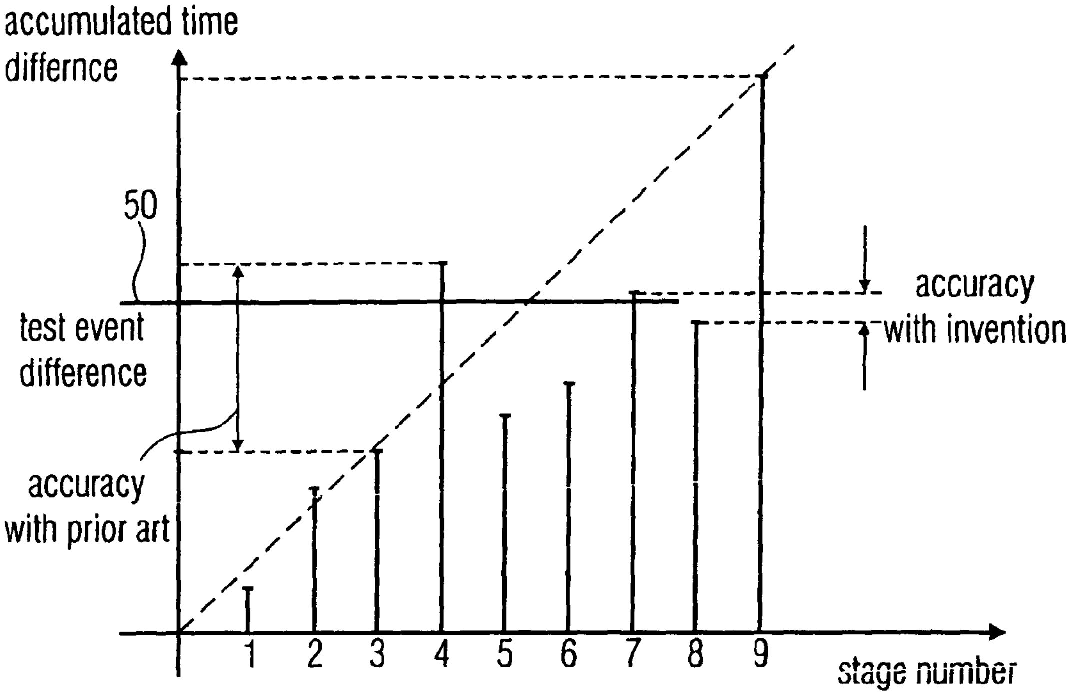
FIG. 5*a* illustrates a diagram representing a non-monotonic accumulative time difference versus stage number of a delay line.
FIG. 5*b* illustrates a priority encoder read-out compared to a summation read-out for the example in FIG. 5*a;*
Figure 6:
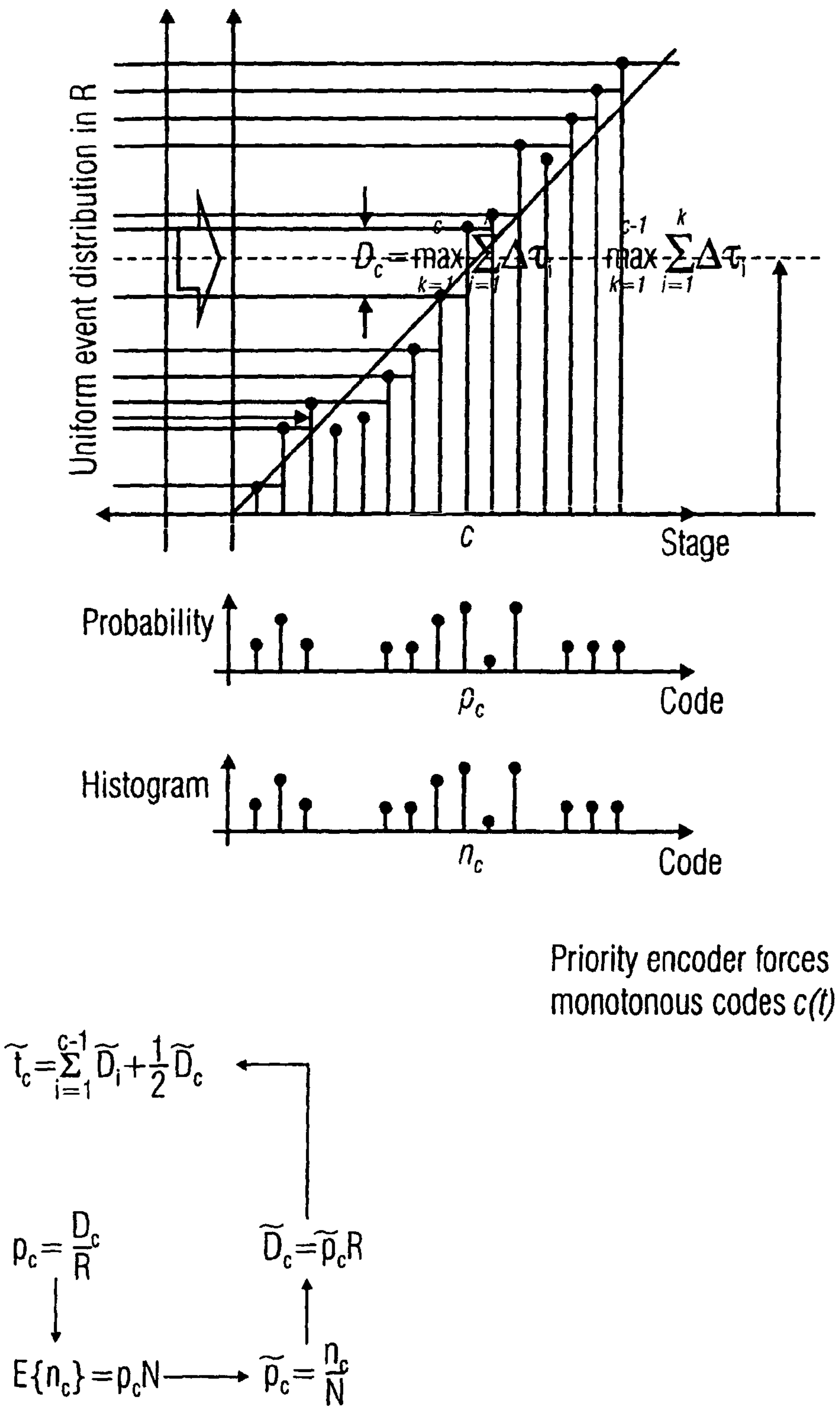
FIG 6 (Prior Art)
FIG. 6 illustrates the functionality of the conventional priority encoder read-out for obtaining monotonous codes.

Before the inventive calibration mode is discussed in connection with FIG. 2, FIG. 6 is discussed illustrating a conventional calibration mode as described in the technical publication authored by Jochen Rivoir. The upper proportion of FIG. 6 illustrates a diagram indicating accumulated delay values of certain stages having a stage number c. Specifically, reference is made to specific stages 3 and 11. Both these stages "shadow" at least one subsequent stage. Specifically, stage 3 shadows stages 4 and 5, and stage 11 shadows stage 12. This means that the shadowed stages 4, 5 and 12 do not occur in the histogram due to the priority encoder readout of the conventional procedure and, therefore, do not receive any probability value. Thus, these stages 4, 5 and 12 do not contribute to the accuracy/resolution of the conventional device as will be discussed in more detail in connection with FIGS. 5*a* to 5*c*. The lower part of FIG. 6 illustrates the procedure for obtaining calibration values for the respective stages, where these calibration values can be provided as probabilities $\tilde{p}_c$. Alternatively, these calibration values can be $n_c$ for each stage (rather than the "shadowed" stages) or can even be $\tilde{D}_c$. In the equations at the bottom of FIG. 6, N is the whole number of measurements in the complete calibration test run, and R is the full measurement range of the TDC delay line. The upper equation of FIG. 6 makes clear that the actual time difference estimate in the FIG. 6 procedure is obtained by adding all calibration values or numbers derived from the calibration values until the stage immediately preceding the stage indicated by the priority encoder output and then by adding half of the calibration value for the actual stage indicated by the priority encoder output.

A similar procedure is applied in accordance with the present invention, but with the important difference that instead of a priority encoder output, a sum encoder output is used for calibration purposes as well as test measurement purposes.

Subsequently, the flow chart in FIG. 2 is discussed in detail. In the first step 20, controller 700 of FIG. 1 is operative to connect the calibration source 602 and, in this embodiment, the reference clock 500 to the delay line 100. If the reference clock 500 is continuously connected to the second input 112 of the delay line, then the controller 700 only has to connect the calibration source to the delay line input 111. In a step 22, the sum over the phase arbiter output 106, i.e., the sum over the indication signals is taken. This procedure is repeated for each one of 2N or more than $N^2$ or more calibration events, where N is the number of stages in the delay line 100.

The source for calibration events is a noisy or tittering device producing events equally distributed over the measurement range of the inventive device. The statistical properties of the calibration event source need not be equally distributed in any case. In a non-equally distributed case, the statistical properties should be known and would result in a correction factor for the calibration values. Then, the number of counted occurrences for a certain sum value would correspond to a calibration value over a factor which would be different from a factor for a different sum value. These factors would depend on the specific statistical properties of the calibration source.

Alternatively, an event source and a coarse clock having a small frequency offset to each other can be used. Although both clocks are correlated to each other, the differences of corresponding clock edges over time are equally distributed and can, therefore, be used for calibration purposes.

Now, a measurement is triggered. Then, after the necessitated measurement delay, the test sum value is input into the processor 201 and intermediately stored. Then, a re-trigger impulse is provided (not shown in FIG. 1) and the next calibration measurement takes place. As soon as the calibration sum value for the next calibration measurement is available, a further re-trigger pulse is generated and the next calibration measurement is performed. All these procedures are repeated until a sufficient number of calibration measurements and, therefore, a sufficient number of calibration sum values is intermediately stored in the processor.

Then, in a step 24, the number of occurrences of a respective calibration sum value is determined for each calibration sum value bin. Specifically, in the FIG. 1 embodiment, in which there are N stages, there can be N different calibration sum values. In step 24, the number of occurrences for each of these N different calibration sum values is determined and intermediately stored as $N_c$, where c ranges from 1 to N. Then, in step 26, a calibration value is stored for each calibration sum value bin. The calibration value can be $N_c$, $p_c$ or $D_c$ as discussed in connection with FIG. 6. Naturally, the calibration sum value can also be the actual, i.e., accumulated sum in the sum equation of $t_c$ in FIG. 6 so that, for example, the calibration value for calibration sum value c not only includes $D_c$ or, for example, $0.5 \times D_c$ but, in addition, the result of the complete sum, or alternatively, the values for $t_c$ in absolute terms.

FIG. 3 indicates, for each available test sum value ranging from 1 to N, a table entry or several table entries. For the actually implemented table entry, there is a high number of possibilities which calibration value is necessitated. Hence, the actually stored calibration value will depend on the storage requirements and the processing requirements available for the specific automatic test equipment. If, for example, storage requirements are not such an issue, then it is useful to actually store the complete accumulated delay value $t_c$ as a calibration value. In this case, the sum in FIG. 6 is calculated during a calibration run and the processor simply has to access the storage and has to output the calibration value in a test run. Alternatively, when it is not an issue to determine the different members of the sum equation in FIG. 6, it might be useful in order to save storage place to only store the calibration value such as $p_c$, $n_c$ or $D_c$ for each stage c, rather than the accumulated delay for each stage.

The lower portion of FIG. 3 illustrates the embodiment of FIG. 1, in which a logic "1" indicates that the first event precedes the second event. When the time difference between the first event and the second event is small, then the test sum value is also small. To the contrary, when the time difference is high, then the test sum value is also high. FIG. 1 already illustrates a situation of a non-monotonic result of the delay stages, since a fully monotonic output would necessitate that the output of the third stage 103 is zero as well. In this embodiment, however, the accumulated delay in the third stage is lower than in the second stage so that the situation can happen such that even though the second stage provides a zero output, the third stage provides a "1" output.

Figure 4:
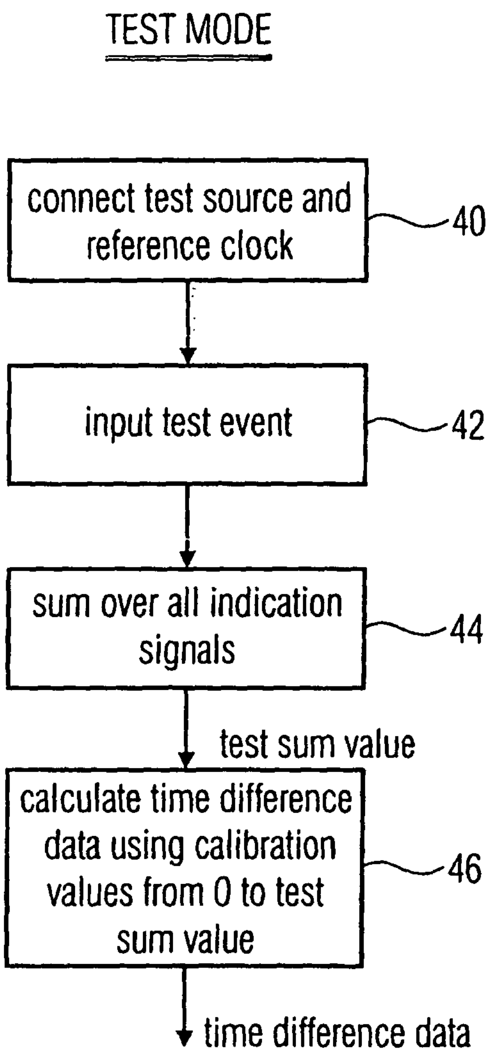
FIG. 4 illustrates an embodiment representing a functionality in a test mode.

Subsequently, the steps performed in a test mode embodiment are discussed in the context of FIG. 4. In a step 40, the test source 601 and the reference clock 500 are connected to inputs 111 and 112 of the delay line 100. Then, in step 42 a test event is input. The test event and a corresponding reference clock as illustrated in FIG. 8 propagate through the delay line and result in several indication lines to have a "1" output and in other indication lines to have a "0" output. In step 44, the "1" outputs are summed over all indication signal lines to obtain a test sum value. The test sum value can either be used for further processing or can be used in the specific operation illustrated in step 46, i.e., that the time difference is calculated using calibration values from zero to the indicated test sum value, when a calibration table is implemented as indicated in FIG. 3 and when the calculation as indicated in FIG. 6 or as discussed in FIG. 5*c* is to be performed.

Although the delay line 100 has been discussed so that a logical "1" indicates that the first even precedes the second event so that the summation device 200 sums over all lines to find a sum value constituted by "1" outputs which would result in a sum output of "2" in the FIG. 1 embodiment, the summation device can be implemented in other manners as well. For example, the summation device could also sum over all "0" lines, i.e., would count all lines having a "0" state. Then, in an additional step the summation device could calculate the difference between the whole number of stages and the sum value in order to obtain the value of lines 106 having a "1" state. Alternatively, the phase arbiters 105 can be implemented differently so that a logical "0" indicates that the first event precedes the second event. In this case, the summation device could be implemented to count the lines having a "0" state in order to obtain the sum value. Again, alternatively, the summation device could count the "1" lines and could then form a difference between N, i.e., the whole number of stages and the "1" count value to obtain the test sum value. Alternatively, the lines 106 can include any additional logic circuit such as inverters at specific stages so that the summation device does not necessarily count lines having one and the same state as long as the summation device only counts the number of stages where the first event precedes the second event or only counts the states, where the first event succeeds the second event. Thus, the summation device 200 is operative to actually count the stages only, in which the delay between the first event and the second event has the same sign, since, from this information, the test sum value is fully defined.

Subsequently, FIGS. 5*a* to 5*c* are discussed in order to show the improvement of the present invention with respect to accuracy compared to the conventional procedure as discussed in FIG. 6. FIG. 5*a* illustrates an exemplary delay line having a non-monotonous accumulated time difference characteristic with respect to the stage number of the individual stage. Specifically, the accumulated time difference of stage 4 "shadows" stages 5, 6, 7 and 8 which has dramatic consequences to the accuracy of the delay line, when the accuracy is defined as the difference between the accumulated time differences represented by two stages. The conventional priority encoder output of a specific test event difference indicated at 50 in FIG. 5*a* would result in indication signals as illustrated in the second line of FIG. 5*b*. The priority encoder output would be 4. This would mean that, in accordance with the equation in FIG. 5*c* and as indicated in the top part of FIG. 5*c*, the time difference estimate t would be determined to be the accumulated delay contribution of stages 1, 2, 3 and the half of the contribution by stage 4. Thus, the estimate t as indicated in the first line of FIG. 5*c* will be an estimate for the test event difference. In the worst case, the test event difference is close to the accumulated time difference of stage 3 or close to the accumulated time difference of stage 4. Thus, the actual maximum error is equal to half the range labeled in FIG. 5*a* as "accuracy with prior art".

Contrary thereto, the present invention results in a test sum value 6 and since, in accordance with the present invention no stages are shadowed, the actual maximum error of the measured time difference estimate is equal to half of the amount labeled as "accuracy with invention" in the worse case scenario in which the test event difference is close to the accumulated time difference of stage 7 or stage 8.

A further difference between the inventive procedure compared to the conventional procedure is that in accordance with the invention, for each stage, a calibration value is obtained. However, the calibration is not associated to a specific stage, but is associated to a specific count value, which is composed of contributions from different stages. Contrary thereto, a conventional calibration value is associated with an actual stage and for shadowed stages 5, 6, 7 and 8, any calibration values do not, at all, exist when the statistical calibration method is implemented in connection with the priority encoder.

FIG. 5*c* indicates the differences of calculating the actual time difference estimate $\tilde{t}$. While, conventionally, the calibration values for the first three stages and the half of the calibration value for the fourth stage are accumulated, the situation is different in the invention. In the invention, the calibration values are not associated with the specific stage number, but are associated with a specific count value. This can be seen from the table in FIG. 5*c*. Test sum value c equal to 5, for example, corresponds to the time delay increase between the two adjacent stages 6 and 8, which is indicated as D. Thus, the inventive procedure results in a "logical resorting" of the calibration values in accordance with monotonic rules so that all available stages are utilized for calculating an actual estimate.

Furthermore, in contrast to the convention, the sum extends from 0 to c-1, while the sum in the conventional procedure extends between 1 and c-1.

Figure 7:
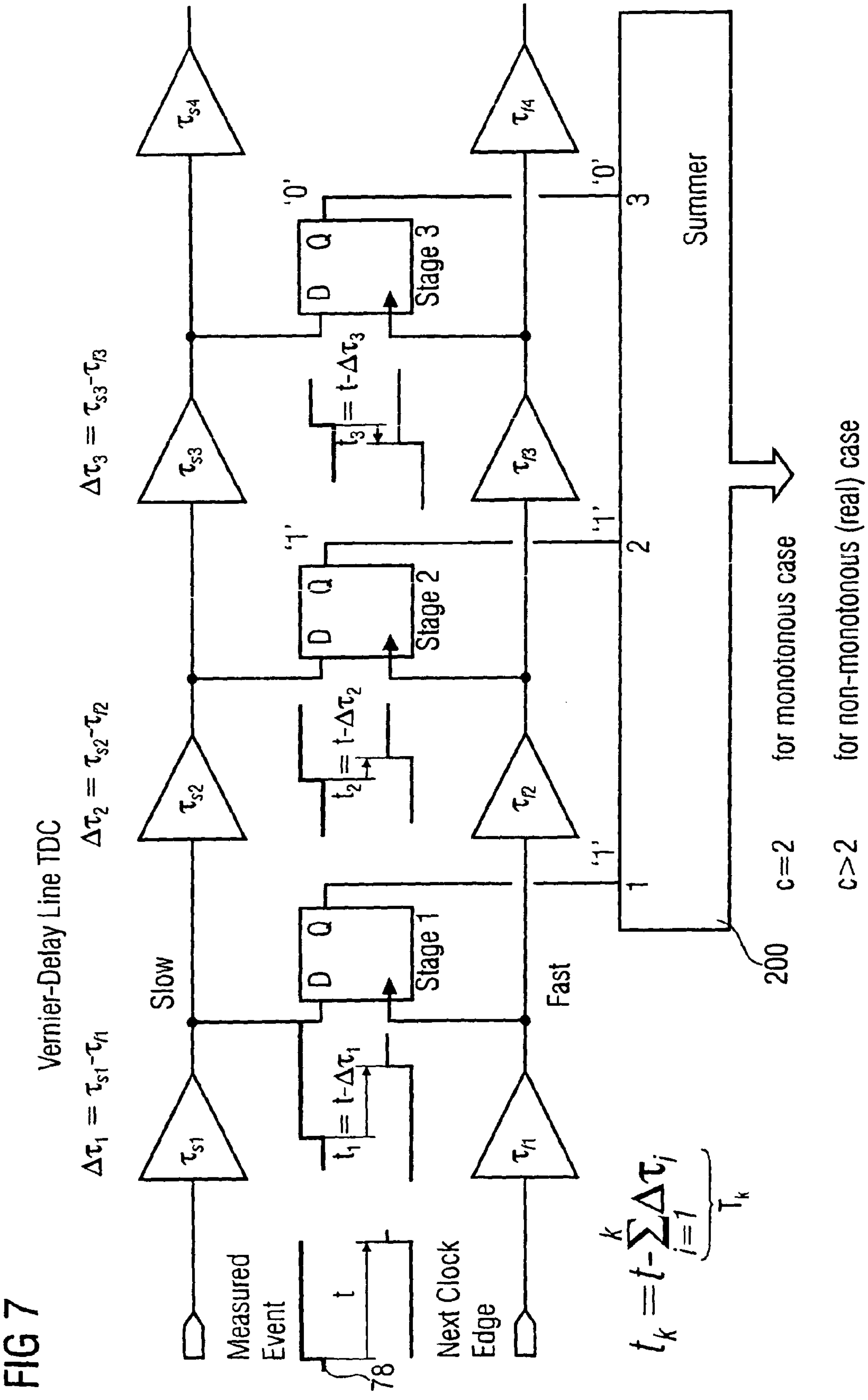
FIG. 7 illustrates an inventive apparatus for estimating having a specific delay line implemented as a vernier delay line.

FIG. 7 illustrates a more detailed illustration of the inventive apparatus for estimating having four stages 101 to 104. Specifically, each delay is implemented as a buffer stage having a certain delay. In particular, for example, delay D2S from FIG. 1 is implemented by a buffer 70 having a buffer delay $\tau_{s2}$ and the corresponding delay from the second part, i.e. D2F of FIG. 1 corresponds to a buffer 72 having a specific buffer delay $\tau_{f2}$, which is different from $\tau_{s2}$. In this embodiment, in FIG. 7, the index s indicates "slow", while the index f indicates "fast". This notation clarifies that the buffer 70 is in the so-called "slow" branch of the delay line and buffer 72 is in the so-called "fast" branch of the delay line. Additionally, the phase arbiters 105 are implemented as D-flip-flops, where the delayed value from the first part of the delay line of a specific stage is connected to the D input of the flip-flop, where the delayed signal in the second part of a stage of the delay line is connected to a clock input of the flip-flop and where the Q output of the flip-flop is the indication line 106 carrying the indication signal. These signals from each stage are input to the summation device 200. The illustration in FIG. 7 clarifies that in the first two stages, the first event 78 precedes the second event 79, while in the third stage 103, this situation changes and the first event 78 succeeds the second event 79.

The count value for the FIG. 7 embodiment would be equal to for the monotonous (ideal) case, but the count value would be greater than 2 for a non-monotonous (real) case provided that the time t actually measured would hit a specific accumulated time difference in a stage, which is smaller than the accumulated time difference of a preceding stage.

Figure 9:
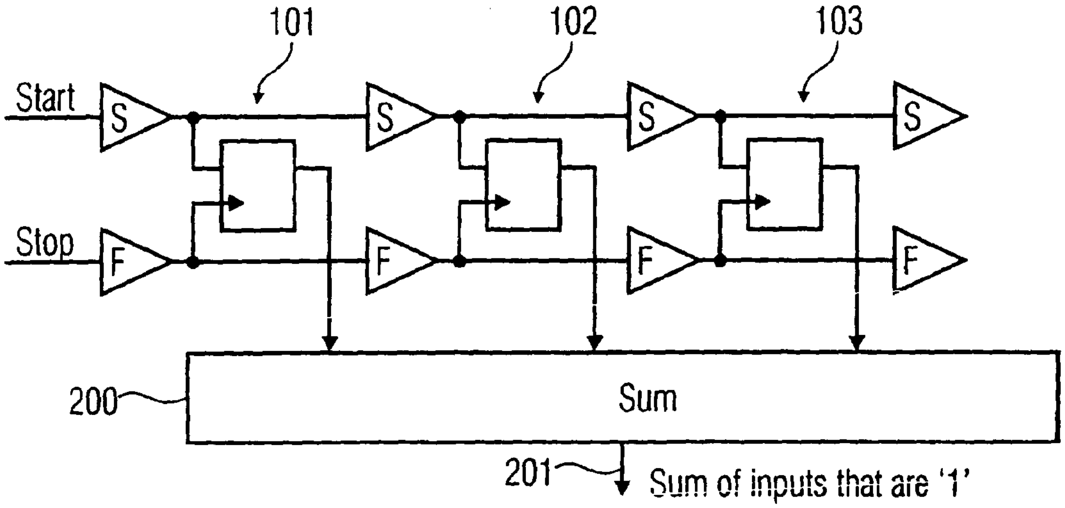
FIG. 9 illustrates another representation of an embodiment of the apparatus for estimating.

FIG. 9 illustrates an embodiment of the present invention in which each stage includes a buffer S or F having a certain delay and a single D-flip-flop.

Figure 10:
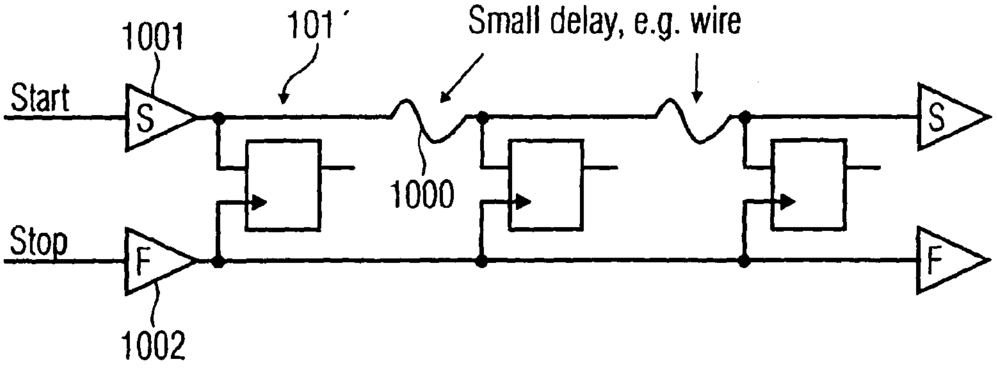
FIG. 10 illustrates a different implementation having passive rather than active delays in some stages.

Since, however, all stages contribute to the measurement accuracy in accordance with the present invention, many different flexible constructions of the delay line can be applied, which is discussed in connection with FIGS. 10, 11, 12 and 13. Exemplarily, FIG. 10 illustrates a situation in which a stage 101' includes a passive delay, such as a small piece of wire or a small piece of a conductor track on a substrate in the first part of the stage where the second part of the stage does not include any additional delay, but only includes the minimum delay incurred by connecting the stages. Thus, a difference between the delay in the first part and the delay in the second (lower) part is created, which is used for delay line measurements. The passive delay 1000 helps to reduce costs when, in embodiments, passive delays can be produced easier and cheaper than an active delay (e.g. a buffer), such as 1001 or 1002. In order to make sure that the signal level is large enough, it is advantageous in the FIG. 10 embodiment that a stage having an active delay, i.e. having a buffer follows a single or only a small number, such as five or less individual stages having only a passive delay. Exemplarily, FIG. 10 illustrates a situation that a buffer stage follows two wire stages.

In this embodiment, the propagation delay through the delay line is reduced. This allows a faster sample rate of time measurements.

Figure 11:
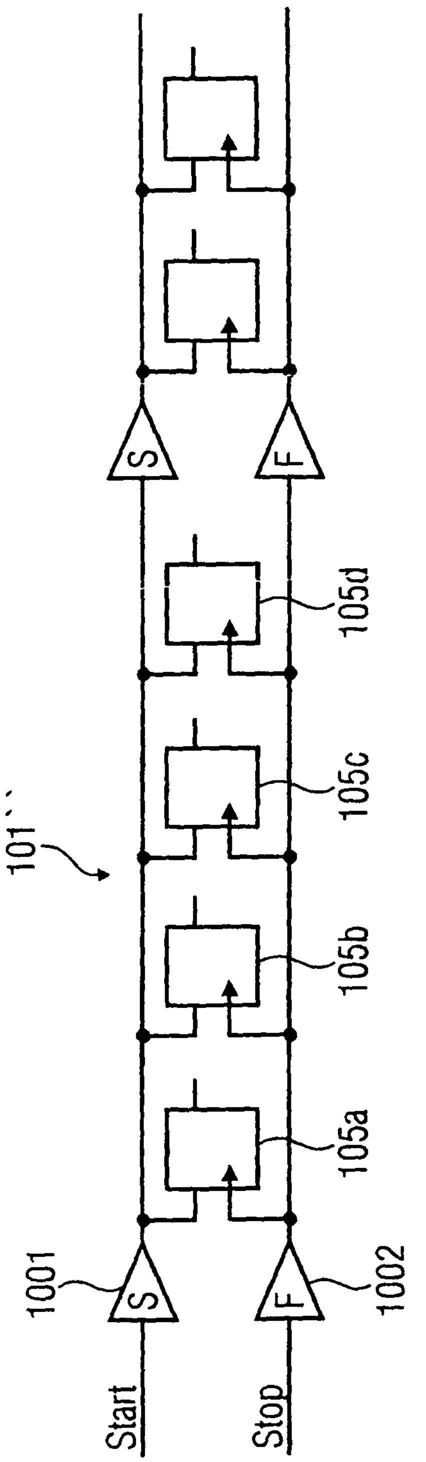
FIG. 11 illustrates a vernier delay line with statistical sampling per buffer stage.

FIG. 11 illustrates an embodiment of a delay line with statistical sampling per buffer stage. In particular, buffer stage 101" includes not only a single phase arbiter 105 as in FIG. 1, but includes at least two or a plurality of phase arbiters 105*a*, 105*b*, 105*c*, 105*d*, which are connected in parallel to each other. The statistical variation of flip-flop sampling provides a denser choice of accumulated vernier delays and, therefore, improves resolution.

Advantages of the FIG. 11 embodiment are the faster sample rate compared to a conventional vernier delay line and a large time measurement range of a vernier delay line with a fine resolution of sampling offsets. Each of the different phase arbiters 105*a* is implemented as a real circuit and, therefore, has a different decision threshold and a different input/output noise characteristic so that each phase arbiter provides an output signal to the summation device 200, where, in the calibration process, for each sum value output by the summation device, a calibration value is provided and where due to the fact that the variations between the different phase arbiters 105*a* to 105*d* are quite small, a very high resolution for a test time difference is obtained, since the "accuracy with invention" range as indicated in FIG. 5*a* is extremely small for the FIG. 11 embodiment.

Figure 12:
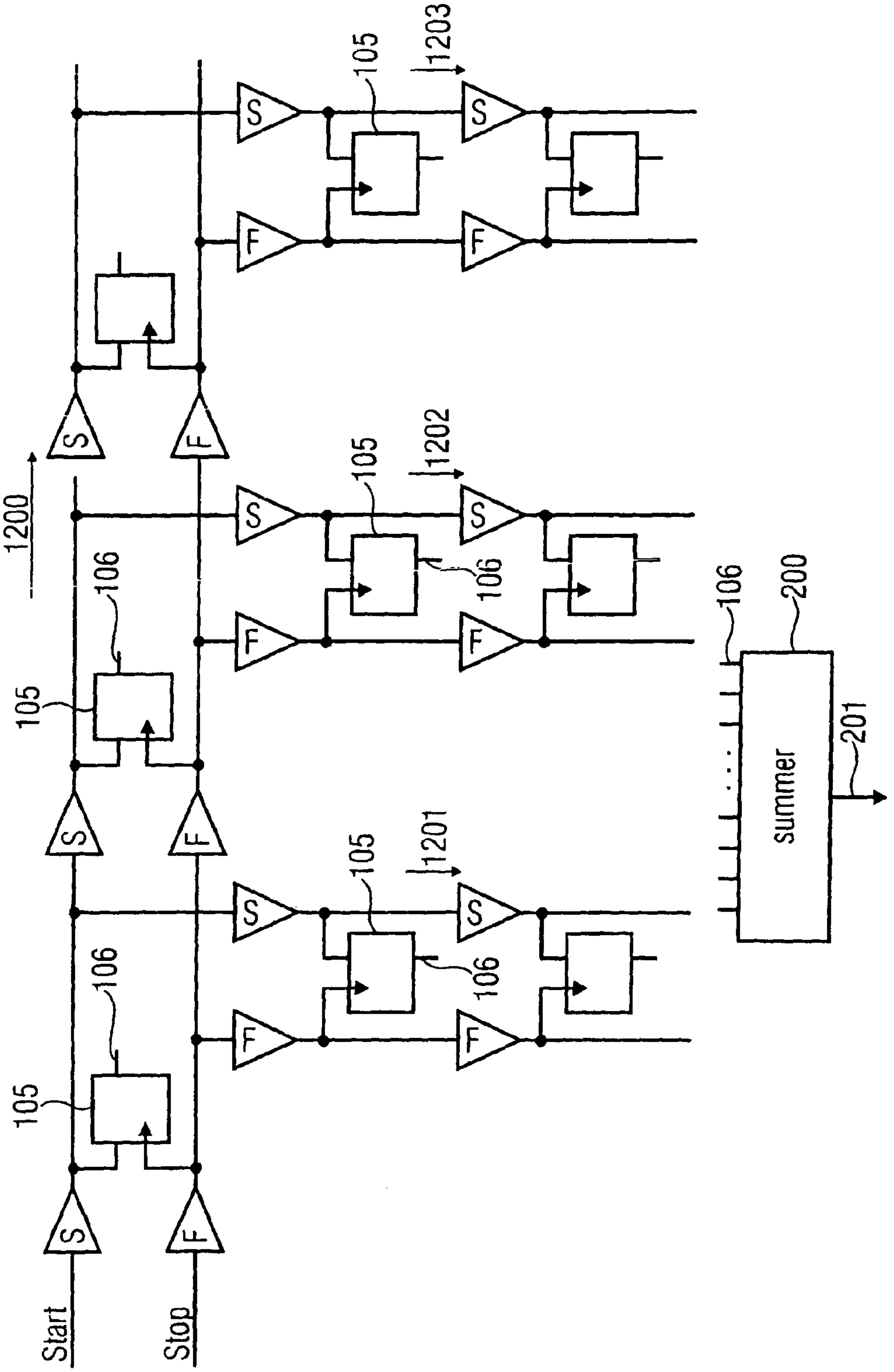
FIG. 12 illustrates a vernier delay line with branches.

FIG. 12 illustrates a delay line with branches. Specifically, the delay line includes a main branch extending from the left to right in FIG. 12 and indicated as 1200. Furthermore, the FIG. 12 delay line includes a plurality of so-called subsidiary branches extending in the vertical direction in FIG. 12 and indicated as 1201, 1202 and 1203. Furthermore, although not shown in FIG. 12, each phase arbiter 105 has an indication signal output connected to the summation device 200 so that the summation device 200 provides a test sum value or a calibration sum value 201 by summing over all flip-flop outputs 106 from all branches.

It is to be emphasized that due to the fact that a summation device is used in contrast to the priority encoder, the arrangement of the stages is not used for any calculation. Thus, the conventional requirement that all stages have to be sequential to each other does not exist any more in the present invention, so that any available arrangement can be used. A specific arrangement is the three or more branches arrangement of FIG. 12. All these arrangements where two pulses propagate in parallel to different branches result in a reduction of the necessitated time for a single measurement, i.e. for the determination of a single time difference. Thus, since the time necessitated for a single measurement is reduced, the retrigger frequency can be increased, so that more measurements can be performed at the same time or the complete time for a whole measurement run is reduced compared to the convention. All these advantages are obtained without any penalty with respect to the chip area, since the inventive scenario does not need more stages than conventionally for obtaining the same accuracy.

Figure 13:
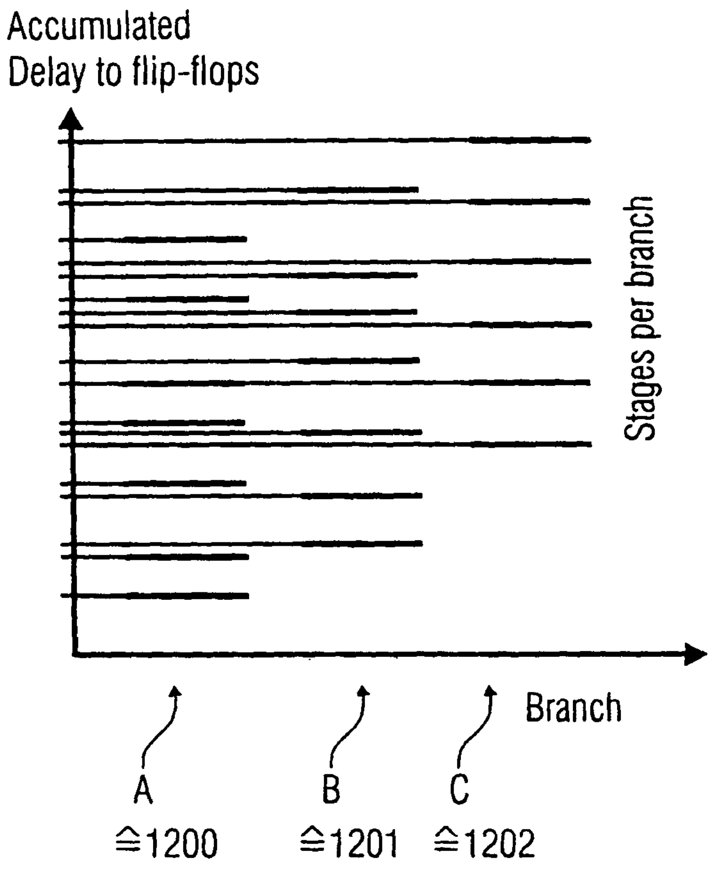
FIG. 13 illustrates a schematic chart for illustrating the result of summing over the indication signals of all branches.

Regarding the delay difference between the delay of the first part and the delay of the second part, it is advantageous that all stages have a nominal value, which is equal over the whole circuit. This requirement, however, is only for semiconductor processing or design reasons. Since any monotonous behavior does not count any more in the present invention, even a random distribution of delay differences is useful. This is verified by FIG. 13. FIG. 13 illustrates the accumulated delay for different flip-flops of different branches. The far left portion in FIG. 13 indicated at. "A" corresponds to the "main" branch 1200. The portion in the middle of FIG. 13 indicated by "B" corresponds to the first vertical branch 1201 and the third portion "C" corresponds to the second vertical branch 1202 of FIG. 12. It becomes clear from FIG. 13 that when the crossing points between the horizontal lines and the vertical axis are considered, a quite dense accumulated delay raster is obtained with a sufficient number of branches arranged in parallel. The distribution intensity of the different measurable accumulated delays can even be enhanced when each stage receives different delays and, consequently, different delay differences. However, due to the statistical variations of the delay differences of stages all having the same "nominal" delay difference values, existing designs in which the same delay difference is intended for each stage can, nevertheless, be used.

Depending on certain implementation requirements of the inventive methods, the inventive methods can be implemented in hardware or in software. The implementation can be performed using a digital storage medium, in particular, a disc, a DVD or a CD having electronically-readable control signals stored thereon, which co-operate with programmable computer systems such that the inventive methods are performed. Generally, the present invention is therefore a computer program product with a program code stored on a machine-readable carrier, the program code being operated for performing the inventive methods when the computer program product runs on a computer. In other words, the inventive methods are, therefore, a computer program having a program code for performing at least one of the inventive methods when the computer program runs on a computer.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An apparatus for estimating data relating to a time difference between two events, comprising:

a delay line comprising a plurality of stages arranged in non-opposing timing orientation, each stage comprising a first delay in a first part and a second delay in a second part, the first delay and the second delay being different from each other, and each stage comprising a phase arbiter indicating by indication signal in a calibration mode comprising one of two different states, whether each of a plurality of events in a reference clock in the first part precedes or succeeds each of a plurality of events in a calibration source in the second part;

a summation device for summing over the calibration indication signals in the calibration mode of the plurality of stages to acquire a calibration sum value;

a controller for instructing the calibration mode in which a multitude of different calibration measurements is performed, wherein wherein each calibration measurement results in a calibration sum value by the summation device;

wherein a number of occurrences for each different calibration sum value is determined; and wherein a calibration value for each calibration sum value is determined based on the number of occurrences of the given calibration sum value and not associated with a specific stage in the multitude of different calibration measurements;

a calibration storage for storing the calibration values associated with different calibration sum values acquired by the summation device in the calibration mode;

the delay line comprising the plurality of stages, and each stage comprising the phase arbiter indicating by a test indication signal in a test mode comprising one of two different states, wherein an event in the reference clock in the first part precedes or succeeds an event in a test source in the second part;

the summation device for summing over the test indication signal in the test mode of the plurality of stages to acquire a test sum value; and a processor for processing the test sum value acquired by the summation device in the test mode and a given calibration value acquired from the calibration storage to estimate a time difference between the event in the reference clock and the even in the test source.

2. The Apparatus in accordance with claim 1:

in which the phase arbiter is operative to provide the indication signal so that the indication signal indicates, in the first state, that the first event precedes the second event in the stage and indicates, in a different second state, that the first event succeeds the second event in the stage, and in which the summation device is operative to count either the indication signals from the plurality of stages comprising the first state or the indication signals from the plurality of stages comprising the second state.

3. The apparatus in accordance with claim 1:

in which the phase arbiter in a stage is implemented as a D-flip-flop, and in which the summation device comprises a digital counter for counting only the D-flip-flop outputs of the plurality of stages comprising a certain state among the two different states.

4. The apparatus in accordance with claim 1 in which the controller is operative to calculate the calibration value using a ratio of the number of occurrences and a total number of the multitude of calibration measurements.

5. The apparatus in accordance with claim 1 in which the delay line comprises a first event propagation path formed by first parts of the stages and a second event propagation path formed by second parts of the stages, wherein the delay in the first part or the second part or the delay difference between the first part and the second part is implemented as one or a combination of a buffer amplifier, a line portion or a delay induced by the phase arbiter.

6. The apparatus in accordance with claim 1, wherein the plurality of stages comprises at least two stages comprising buffer amplifiers in both parts, the buffer amplifiers comprising different delay values, so that one part is a slow part comprising a higher delay and the other part is a fast part comprising a lower delay, and in which between the at least two stages, an intermediate stage is located in which either the first part or the second part, or both parts, comprise a wire and do not comprise an amplifier.

7. The apparatus in accordance with claim 1 in which at least one stage comprises a plurality of phase arbiters comprising different characteristics, each phase arbiter providing an indication signal, and in which the summation device is operative to sum over the indication signals from the plurality of phase arbiters.

8. The apparatus in accordance with claim 1, in which the delay line comprises at least a first branch and a second branch where the branches are connected in parallel to each other, so that the two events concurrently propagate through the branches.

9. The apparatus in accordance with claim 8 in which the first branch is a main branch comprising sequentially arranged delay stages, wherein the second branch is connected to a delay stage of the main branch and a third branch is connected to a different delay stage of the main branch.

10. The apparatus in accordance with claim 1, in which each of the phase arbiters of the plurality of stages comprises a flip-flop outputting, as the indication signal, a logical "1" or a logical "0" depending on a time relation of the two events in the stage, and in which the summation device is a digital counter connected to outputs of the flip-flops, on which the indication signals are provided, the digital counter being operative to count the number of flip-flop outputs, on which a single pre-selected logical state is present.

11. The apparatus in accordance with claim 1, in which the calibration storage is operative to store, for each possible sum value, a calibration value indicating a time difference span between the sum value and an adjacent sum value.

12. The apparatus in accordance with claim 1, in which the processor is operative to calculate the data relative to the time difference estimate by accumulating calibration values from a predetermined minimum or maximum sum value until a test sum value minus 1 and by adding at least a portion of the calibration value for the test sum value to acquire a time difference estimate.

13. The apparatus in accordance with claim 1, in which the processor is operative to calculate the data relating to the time difference based on the following equations:

$$\tilde{t} = \sum_{i=0}^{c-1} \tilde{D}_i + \frac{1}{2}\tilde{D}_c$$

$$\tilde{D}_i = \frac{n_i}{N} T_R$$

wherein $\tilde{t}_c$ is the time difference estimate, wherein c is the test sum value, wherein $D_i$ is a calibration value for a test sum value equal to i, wherein $n_i$ is the number of occurrences of a certain calibration sum value in a calibration procedure, wherein N is the complete number of measurements in a calibration procedure, and wherein $T_R$ is the whole measurement range of the delay line.

14. A method of calibrating a delay line comprising:

connecting by a controller a source of calibration signal events to a first input connected to the first part of a first stage of the plurality of stages of the delay line, the source of calibration signal events being such that the calibration signal events are distributed over a full measurement range of the delay line, the delay line comprising a plurality of stages, each stage comprising a first delay element in a first part and a second delay element in a second part, a first delay from the first delay element and a second delay from the second delay element being different from each other, and each stage comprising a phase arbiter coupled between the first and second part of the delay line and indicating by an indication signal, comprising one of two different states, whether the calibration signal event in the first part precedes or succeeds a second signal event in a reference clock in the second part;

in response to a calibration signal event, summing by a summation device, over the indication signals of the plurality of stages to acquire a calibration sum value;

repeating the step of summing for a number of calibration events, which is higher 2N, N being the number of all stages of the delay line, so that more than 2N calibration count values are acquired; and for each calibration sum value, determining by a processor a number of occurrences of the calibration sum value in all calibration count values and storing a calibration value for the calibration sum value in a calibration storage, wherein the calibration value for each calibration sum value depends on the number of occurrences of the given calibration sum value and not associated with a specific stage.

15. An apparatus for calibrating a delay line comprising a plurality of stages, each stage comprising a first delay in a first part and a second delay in a second part, the first delay and the second delay being different from each other and each stage comprising a phase arbiter indicating by an indication signal comprising one of two different states, whether a first event in the first part precedes or succeeds a second event in a reference clock in the second part, comprising:

a connector for connecting a source of calibration events to a first input connected to the first part of a first stage of the plurality of stages, the source of calibration events being such that the calibration events are distributed over a full measurement range of the delay line;

a summation device for summing over the indication signals of the plurality of stages to acquire a calibration sum value, in response to a calibration event;

a controller for repeating the step of summing for a number of calibration events, which is higher than 2N, N being the number of all stages of the delay line, so that more than 2N calibration count values are acquired; and a processor for determining, for each calibration sum value, a number of occurrences of the calibration sum value in the more than 2N calibration count values and storing a calibration value for the calibration sum value in a calibration storage, wherein the calibration value for each calibration sum value depends on the number of occurrences of the given calibration sum value and not associate with a specific stage.

16. A non-transitory digital storage medium having stored thereon a program code for performing when running on a computer, the method of calibrating a delay line comprising a plurality of stages, each stage comprising a first delay in a first part and a second delay in a second part, the first delay and the second delay being different from each other and each stage comprising a phase arbiter indicating by an indication signal comprising one of two different states, whether a first event in the first part precedes or succeeds a second event in a reference clock in the second part, the method comprising:

connecting a source of calibration events to a first input connected to the first part of a first stage of the plurality of stages, the source of calibration events being such that the calibration events are distributed over a full measurement range of the delay line;

in response to a calibration event, summing over the indication signals of the plurality of stages to acquire a calibration sum value;

repeating the step of summing for a number of calibration events, which is higher 2N, N being the number of all stages of the delay line, so that more than 2N calibration count values are acquired; and for each calibration sum value, determining a number of occurrences of the calibration sum value in all calibration count values and storing a calibration value for the calibration sum value in a calibration storage, wherein the calibration value for each calibration sum value depends on the number of occurrences of the given calibration sum value and not associated with a specific stage.

* * * * *